(12) United States Patent
Ross et al.

(10) Patent No.: US 9,010,616 B2
(45) Date of Patent: Apr. 21, 2015

(54) LOW VOID SOLDER JOINT FOR MULTIPLE REFLOW APPLICATIONS

(75) Inventors: Jordan Peter Ross, Whitesboro, NY (US); Amanda M. Hartnett, Utica, NY (US)

(73) Assignee: Indium Corporation, Clinton, NY (US)

( * ) Notice: Subject to any disclaimer, the term of this patent is extended or adjusted under 35 U.S.C. 154(b) by 37 days.

(21) Appl. No.: 13/483,376

(22) Filed: May 30, 2012

(65) Prior Publication Data

US 2012/0305632 A1     Dec. 6, 2012

Related U.S. Application Data

(60) Provisional application No. 61/491,757, filed on May 31, 2011.

(51) Int. Cl.
*B23K 33/00* (2006.01)
*B23K 31/02* (2006.01)
(Continued)

(52) U.S. Cl.
CPC ............ *H05K 13/0465* (2013.01); *H01L 24/83* (2013.01); *H01L 2924/15311* (2013.01); *H01L 23/36* (2013.01); *H01L 23/3736* (2013.01); H01L 2924/01327 (2013.01); H01L 2224/29012 (2013.01); H01L 2224/27334 (2013.01); *H01L 23/10* (2013.01); *H01L 21/50* (2013.01); *H01L 24/16* (2013.01); *H01L 24/27* (2013.01); *H01L 24/29* (2013.01); H01L 24/32 (2013.01); H01L 24/73 (2013.01); H01L 24/81 (2013.01); H01L 24/92 (2013.01); H01L 2224/16225 (2013.01); H01L 2224/29015 (2013.01); H01L 2224/29018 (2013.01); H01L 2224/29109 (2013.01); H01L 2224/32225 (2013.01); H01L 2224/32245 (2013.01); H01L 2224/73204 (2013.01); H01L 2224/73253 (2013.01); H01L 2224/81815 (2013.01); H01L 2224/83001 (2013.01); H01L 2224/83075 (2013.01); H01L 2224/83136 (2013.01); H01L 2224/8314 (2013.01); H01L 2224/8321 (2013.01); H01L 2224/83439 (2013.01); H01L 2224/83444 (2013.01); H01L 2224/83447 (2013.01);
(Continued)

(58) Field of Classification Search
USPC ............ 228/122.1, 123.1, 124.1, 124.5, 178, 228/179.1
See application file for complete search history.

(56) References Cited

U.S. PATENT DOCUMENTS 5,409,865 A * 4/1995 Karnezos ........................ 29/827
5,817,194 A * 10/1998 Nagai et al. .................... 148/400
(Continued)

FOREIGN PATENT DOCUMENTS

EP          628370 A1 * 12/1994
JP     2005236071 A *  9/2005

OTHER PUBLICATIONS

English computer translation JP 2005236071.*
(Continued)

*Primary Examiner* — Erin Saad
(74) *Attorney, Agent, or Firm* — Sheppard Mullin Richter & Hampton LLP

(57) ABSTRACT

A method is provided for the forming of a metallic solder joint without a liquid flux to create a solder joint that has minimal voids and can be reflowed multiple times without void propagation. This process can be done for any solder alloy, and is most specifically used in the application of first level thermal interface in a IC or micro processor or BGA microprocessor.

26 Claims, 11 Drawing Sheets

(51) Int. Cl.
*H05K 13/04* (2006.01)
*H01L 23/00* (2006.01)
*H01L 23/36* (2006.01)
*H01L 23/373* (2006.01)
*H01L 23/10* (2006.01)
*H01L 21/50* (2006.01)

(52) U.S. Cl.
CPC ............... *H01L 2224/83455* (2013.01); *H01L 2224/83815* (2013.01); *H01L 2224/92125* (2013.01); *H01L 2224/92225* (2013.01); *H01L 2224/2711* (2013.01); *H01L 2224/29016* (2013.01); *H01L 2924/01322* (2013.01)

(56) References Cited

U.S. PATENT DOCUMENTS

| | | | |
|---|---|---|---|
| 7,593,228 B2 | 9/2009 | Jarrett et al. | |
| 7,651,938 B2 | 1/2010 | Too et al. | |
| 8,061,578 B2 | 11/2011 | Hartnett et al. | |
| 2003/0019917 A1 | 1/2003 | Furuno et al. | |
| 2004/0066630 A1 | 4/2004 | Whittenburg et al. | |
| 2006/0258045 A1 | 11/2006 | Ishiguri et al. | |
| 2007/0131737 A1 | 6/2007 | Renavikar et al. | |
| 2007/0152321 A1* | 7/2007 | Shi et al. | 257/704 |
| 2008/0124932 A1* | 5/2008 | Tateishi et al. | 438/692 |
| 2011/0186617 A1* | 8/2011 | Hartnett et al. | 228/246 |

OTHER PUBLICATIONS

International Search Report and the Written Opinion for International App No. PCT/US2012/040197, mailed Dec. 28, 2012, Authorized Officer: Kim, Young Jin.

* cited by examiner

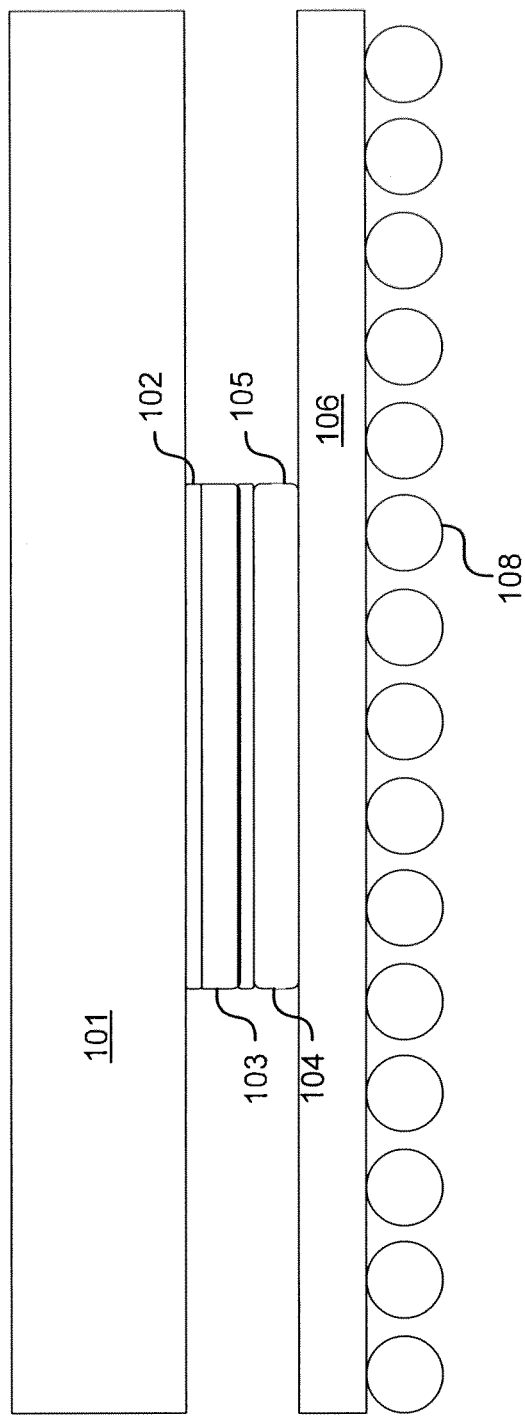

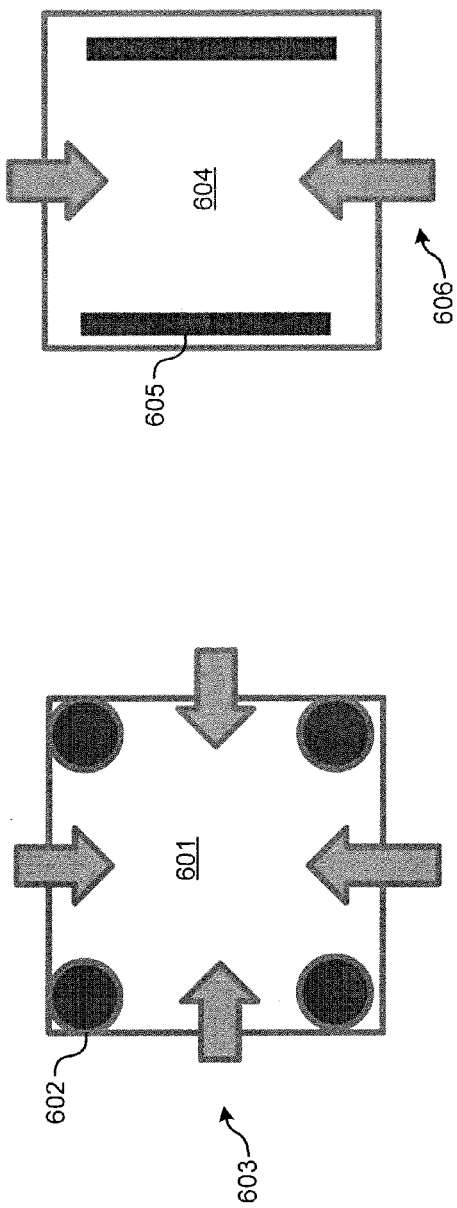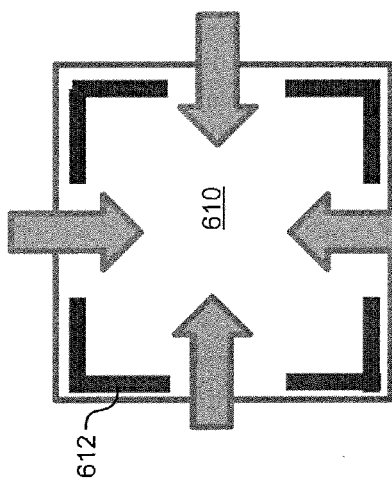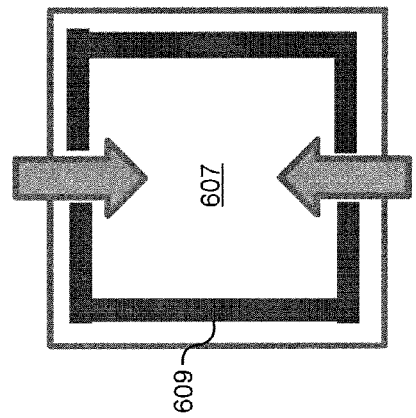

LOW VOID SOLDER JOINT FOR MULTIPLE REFLOW APPLICATIONS

CROSS-REFERENCE TO RELATED APPLICATIONS

This application claims the benefit of U.S. Provisional Application No. 61/491,757, filed on May 31, 2011, the contents of which are hereby incorporated in its entirety.

TECHNICAL FIELD

The present invention relates generally to solder applications, and more particularly soldering without a liquid flux, some embodiments relate to creation of solder joints with low voiding suitable for multiple reflow processes.

DESCRIPTION OF THE RELATED ART

In a typical microprocessor, the chip, or die, is connected to a heat spreader through a heat conductive interface between the back side of the chip and the heat spreader. In today's microprocessor electronics there is a need for a highly conductive interface between the back side of the chip and the heat-spreader, which may include an I.H.S or integrated heat spreader or lid. With the progression of more BGA (ball grid array) processors in circuits, there is a problem with the conventional indium solder processes with a liquid flux as well as interfaces that are created with a polymer based thermal interface material (TIM) such as a phase change material, gel, thermal grease or polymer solder hybrid.

In the case of standard solder TIM applications (sTIM), a liquid flux is dispensed on the chip, a solder preform is placed on the chip, a liquid flux is applied to the back of the preform, the spreader is placed and the solder is then reflowed. The liquid flux is necessary to remove metal oxides and insure adequate wetting and bonding through intermetallics to the bonding surfaces in contact with the molten solder. When this solder joint is created with a liquid flux, it will have some voids, and inside those voids is liquid flux residue. When this liquid flux created solder joint goes through subsequent reflows either at the original reflow temp or elevated temp the subsequent times, the flux residue is baked and volatized which in most cases causes bigger voids and void propagation. It is for this reason that solder joints created with a liquid flux generally are not used on multiple reflow applications, such as chips with an I.H.S and using BGA for subsequent solder attachment to a PCB. Liquid flux can be detrimental for multiple reflow applications because the flux residue that is present in subsequent reflows will boil off and cause existing voids to increase in area. Voids are significantly less thermally and electrically conductive than metallic solder and impair the intent and quality of the TIM. Liquid flux is also an issue because any liquid flux that is present will most likely be corrosive, unless it is cleaned after reflow. In the case of soldering with a simple acidic vapor, no cleaning is necessary and no corrosive residue is left on the substrate or in the solder, assuming the boiling point of the formic or acetic acid has been reached at some point within the profile.

Solder is considered a metallic thermal interface material. Metallic interface materials such as solder, by nature have a very high heat conductivity. In the case of indium (IN element 49) the conductivity is 86 W/mK. This is significantly higher than most polymer based TIMs, which typically have a bulk conductivity of 0.5-3 W/mK. In the case of polymer-based TIMs, subsequent reflows also deteriorate the TIM by hardening the polymers, as well as causing bake out of the TIM, or outgassing, which in turn increases thermal resistance of the interface. However, polymer-based TIMs mechanically adhere to each interface rather than form a physical and chemical bond like a solder does as intermetallics. The purely mechanical bonds that are inherent in polymer TIMs, can be an additional trade off because these bonds can also contain voids, which increase thermal resistance of an already low conductivity interface.

BRIEF SUMMARY OF EMBODIMENTS OF THE INVENTION

Some embodiments of the invention provide a solder joint that can go through multiple reflows and not degrade. These solder joints may be utilized in the internal packaging of a microprocessor prior to attaching the microprocessor to an IC. Embodiments provide a non-liquid flux method in which a flux vapor will be used to remove oxides from the substrates and solder so that a solder joint can be made with minimal voiding and no flux entrapment in the few present voids. This will be referred to as metal direct TIM or mdTIM. This application can be used for microprocessor solder TIM applications, or any other application in need of a solder joint with low voids and no liquid flux. This method can also be used to reflow multiple solder layers with different melt points, also known as Step Soldering. The conventional method of step soldering is to start with a high temp solder and then progressively solder more layers with lower temp solders. This method is conventionally used to avoid melting the previous solder layer. In some embodiments, the method disclosed herein enables use of low melt point solders first and progressive reflows with higher temperatures. This may be referred to as "reverse step soldering."

According to various embodiments of the invention, a method is provided for the forming of a metallic solder joint without a liquid flux to create a solder joint that has minimal voids and can be reflowed multiple times without void propagation. This process can be done for any solder alloy, and is most specifically used in the application of first level thermal interface in an IC or micro processor or BGA microprocessor.

A technique for creating a metallic solder joint that can withstand multiple reflows without void propagation is disclosed. The method discussed is for any type of solder, most particularly this method is used for indium solder or indium based alloys. Tests have also shown that this technique can also be used for lead containing and lead free tin alloys. Parts of this process include solder preform foils, also referred to as "preforms", a reflow oven capable of emitting formic acid vapor and nitrogen gas in a conveyor method, and two solder able surfaces. In most cases a bondline thickness, or thickness of the interface after soldering, of 4-12 mils is considered optimal. In the attached embodiments you will find examples of process flow to achieve such a solder joint, as well as methods of deforming or slitting a preform to allow formic acid vapor to get into interface to remove metal oxides and dispel oxygen from the immediate environment.

According to an embodiment of the invention, a method, comprises forming an assembly comprising a first component, a second component, and a solder preform disposed between the first component and the second component, wherein a liquid flux is not dispensed between the solder preform and first or second component; and reflow soldering the assembly in the presence of nitrogen gas and formic acid vapor to form a soldered assembly.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 1B illustrates a bonded assembly implemented in accordance with an embodiment of the invention.

FIGS. 6A-6D illustrate various dispensing patterns for applying a curable lid material to substrates in accordance with embodiments of the invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

According to various embodiments of the invention, a method is provided for the forming of a metallic solder joint without a liquid flux to create a solder joint that has minimal voids and can be reflowed multiple times without void propagation. This process can be done for any solder alloy, and is most specifically used in the application of first level thermal interface (TIM1) in an IC or micro processor or BGA microprocessor.

Figure 1A:
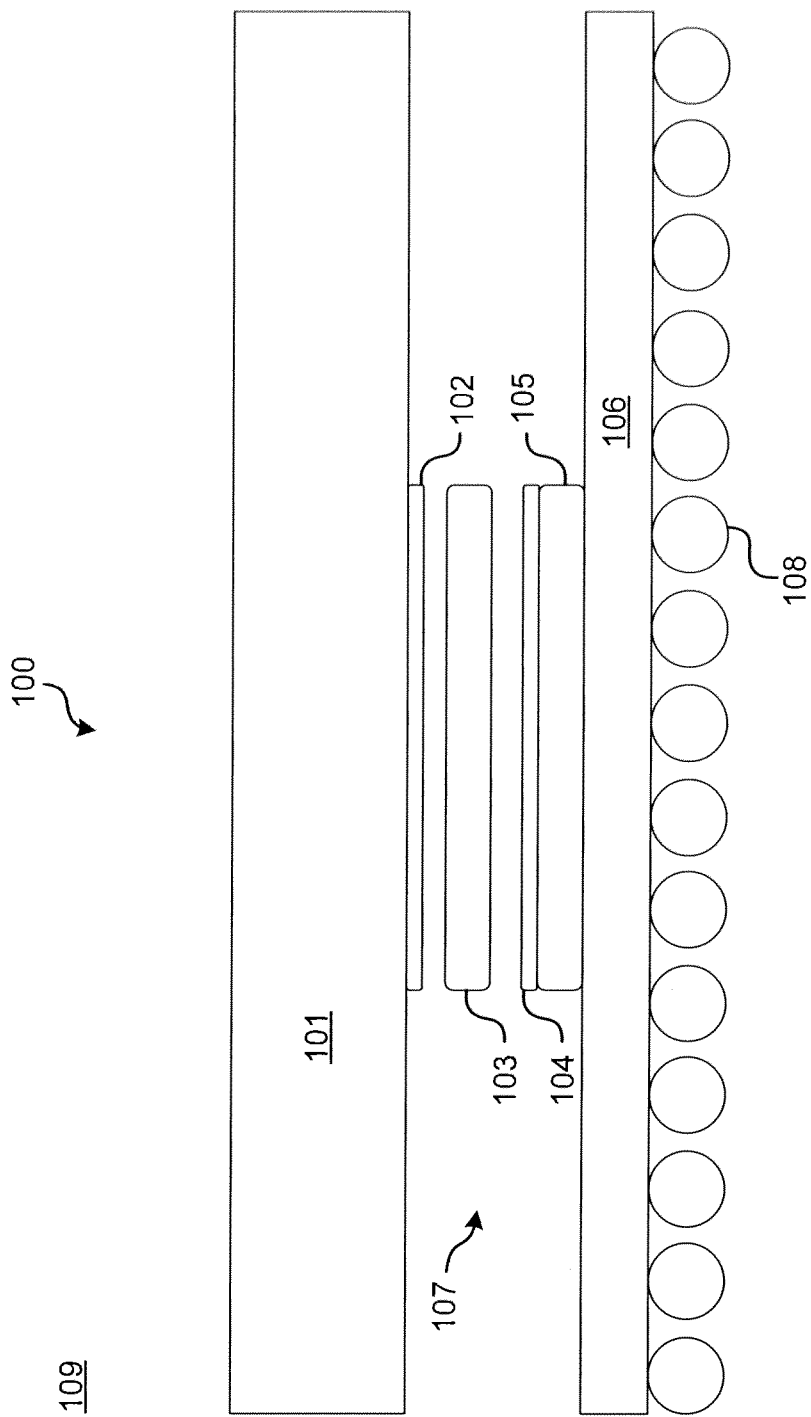
FIG. 1A illustrates an assembly stack and layers according to an embodiment of the invention.

FIG. 1A illustrates an assembly stack and layers according to an embodiment of the invention. The stack 100 comprises a heat spreader, integrated heat spreader, or lid 101 (collectively referred to as a "heat spreader" or "spreader"). A solderable surface 102 is disposed on the underside of the heat spreader 101. In some embodiments, the solderable surface 102 comprises a Ni, Ag, Cu, or other common solderable surface such as Electroless Ni Immersion Gold (ENIG). In some cases, Ni can be a difficult surface to solder, so a sacrificial barrier layer of gold flash oxide barrier is often put on the heat-spreader for conventional soldering with a liquid flux. In some embodiments, a gold or silver oxide barrier layer on the surface 102 may not be necessary when soldering with a simple carboxylic acid vapor if an acceptable void criteria is met. In further embodiments, a gold or silver barrier layer may be applied to the surface 102—for example, for minimal void levels.

The assembly 100 further includes a substrate 106 attached to a processor die 105. For example, the die 105 may have been attached up stream in a flip chip solder assembly in which solder bumps are reflowed but then encapsulated in an underfill or epoxy. In other embodiments, other conventional methods of attaching the processor die 105 to the substrate 106 may be employed. In some embodiments, a plurality of solder bumps 108 are disposed on the bottom surface of the substrate 106. The processor die 105 has a second solderable surface 104 on its backside. In some embodiments, the solderable surface 104 comprises a metallization layer on the chip side of the interface. For example, although solder may wet to the chip 105, an inter-metallic layer is often preferred.

The assembly 100 further comprises a solder preform 103 disposed between the two solderable surfaces 102 and 104. The preform 103 and assembly 100 are configured to provide a path 107 from the exterior of the assembly to the interface between the preform 103 and the surfaces 102 and 104. During reflow, a simple carboxylic acid vapor, such as formic vapor, is present in the reflow chamber 109. The path 107 provides access for the vapor to reach the preform 103 and interfaces. The vapor is used to dissociate the oxide layer during the reflow operation, breaking the metal-oxide bond to bond the free metallic stack together. In some embodiments, the reflow chamber 109 may be a chamber of an inline conveyor oven. In other embodiments, any type of soldering oven may be employed. In further embodiments, the solder preform 103 may be replaced or supplemented with a solid volume of solder dispensed onto one or both of the contacts 102, 104.

In some embodiments, the assembly comprises a plurality of solder contact points 108 disposed on the underside of the substrate 106. In some embodiments, the plurality of solder contact points 108 comprises a grid of solder contact points coupled to metalized contacts. The solder contact points may comprise solder balls, spheres, columns, bumps, or any other solder contact point used in IC attach. In some embodiments, the solder contact points 108 are present on the assembly 100 prior to solder the preform 103. In other embodiments, the solder contact points 108 are provided after the heat spreader 101 is attached to the die 105 and substrate 106.

FIG. 1B illustrates the assembly in the bonded state. The assembly resulting from the illustrated stack comprises a die 105 bonded to the I.H.S. 101 through a solder thermal interface 103. Because a solder paste is not used, and simple carboxylic acid vapor is used to dissolve the oxide layer, there is no liquid flux residue in the assembly. The preform solder in its solid state establishes the bondline for the assembly during the lid attach process. Accordingly, the resultant assembly can go through subsequent reflow processes without out gassing or other defects typically found in subsequent reflows of solders applied with liquid flux. Accordingly, solder 103 can be a low temperature solder, such as indium, or an indium alloy, even if the assembly will be subjected to subsequent high-temperature reflows. The substrate 106 may therefore be a BGA that can be attached to a board with a later, higher-temperature reflow process, for example, using a lead-free solder.

Some force applied to the interface during reflow can help to ensure a good solder joint. However, too much force can squeeze all solder 103 out of the interface. In some embodiments, a fixture or clip can be used to create a standoff during reflow. When a solder reflows it, it melts and turns to liquid. Therefore, if a heat spreader 101 is resting on top of the preform 103 when it melts it may squeeze all the solder out of the interface. A fixture can be created to push down on the spreader slightly but a fixture can also be applied to the interface gap to make sure that a defined bondline is formed. In some embodiments, the fixture may remain as part of the chip package, to prevent disruption of the TIM interface during subsequent reflows. The solid preform 103 can also be used to create the stand-off gap during lid attach process. Before the solder preform 103 is melted the assembly can go through a prep lid seal cure process.

Figure 1C:
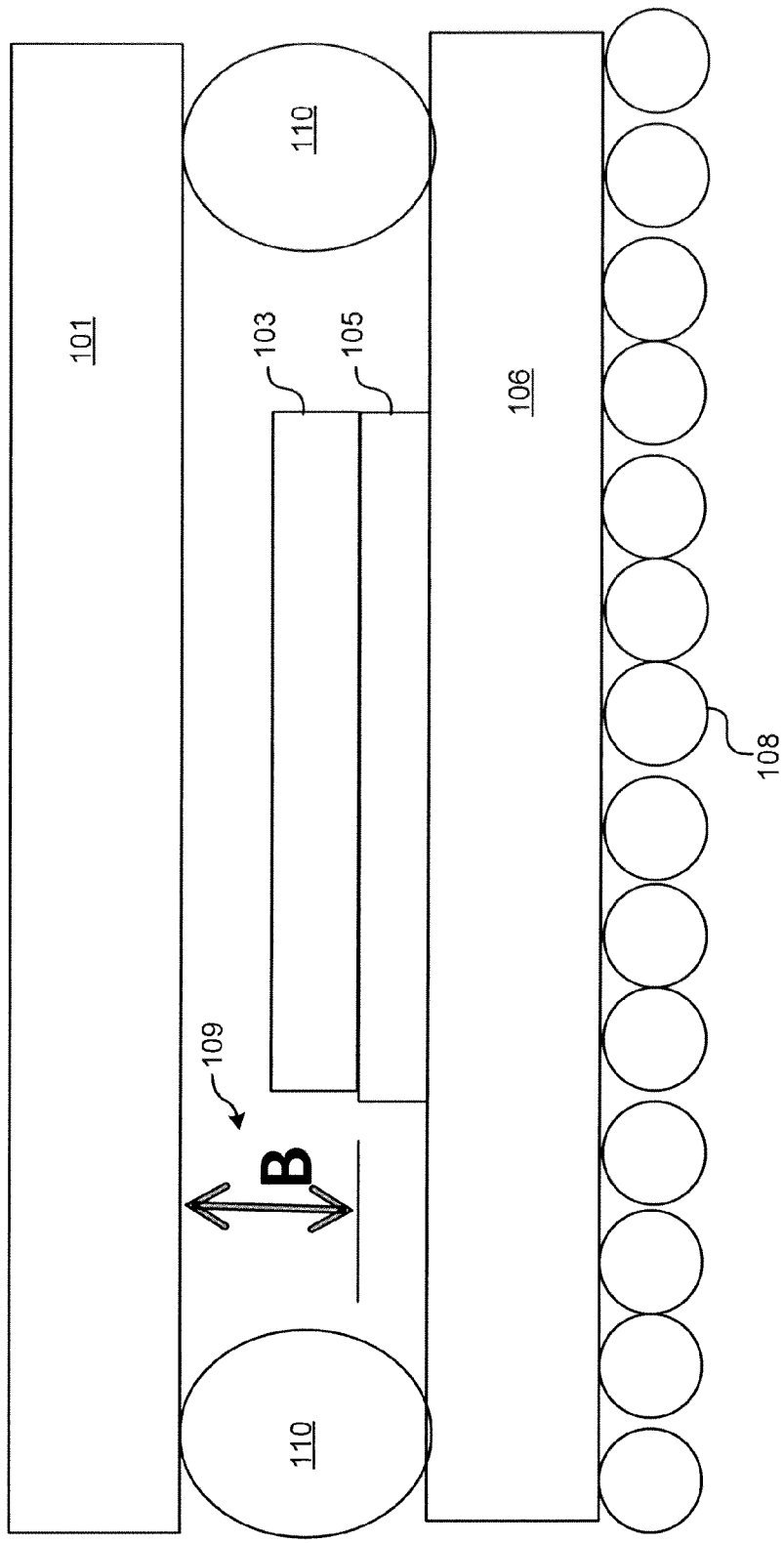
FIG. 1C illustrates an embodiment of the invention employing a pre-soldering lid cure.
Figure 1D:
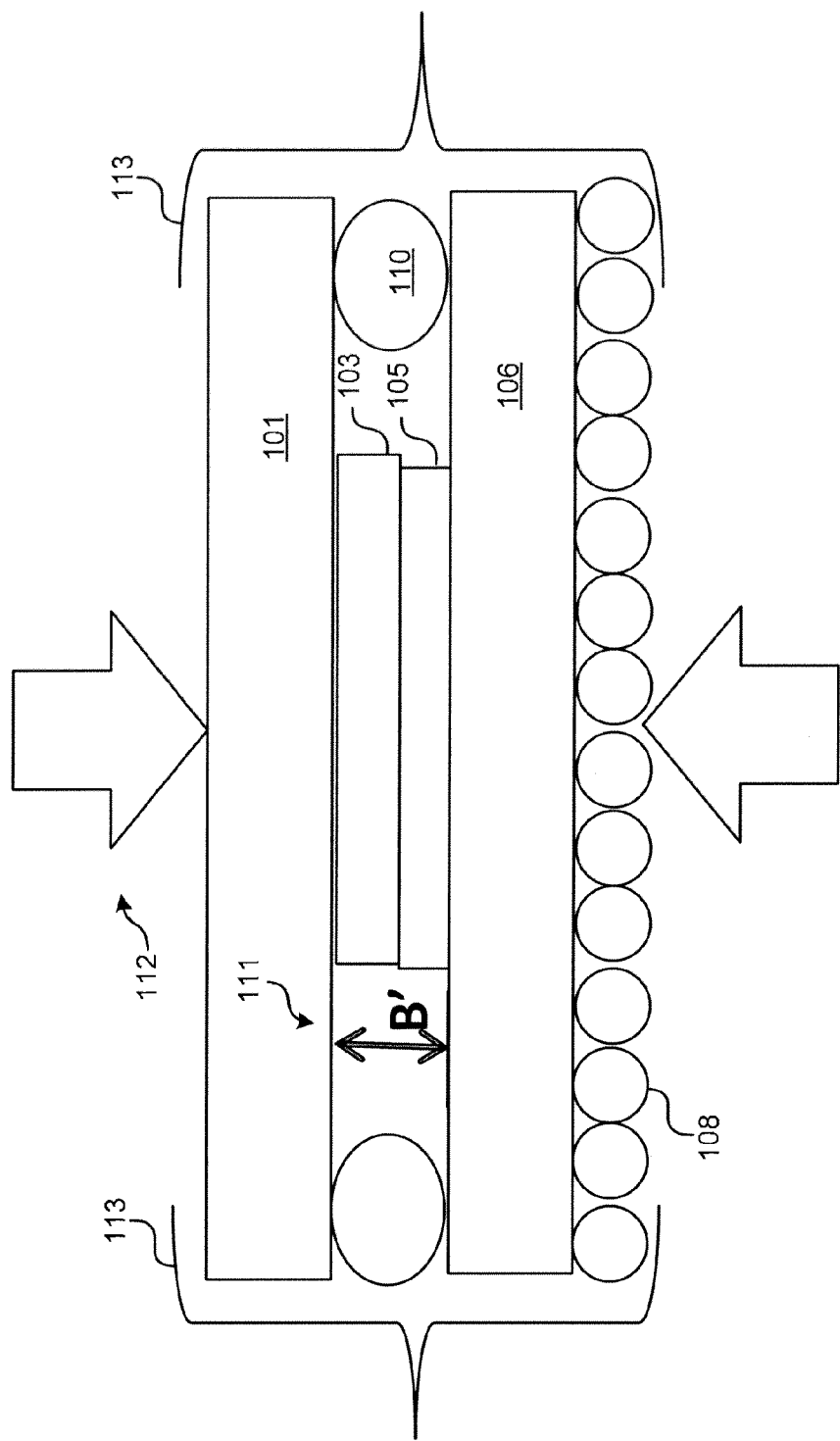
FIG. 1D illustrates the embodiment of FIG. 1C after lid cure.

FIGS. 1C and 1D illustrate the assembly during various stages of a prep lid seal cure process implemented in accordance with an embodiment of the invention. In FIG. 1C a lid seal material 110 has been dispensed between the heat sink 101 and the substrate 106. The lid seal material 110 is dispensed such that a gas pathway is maintained from the environment to the preform 103 and die 105. For example, FIGS. 6A-6D below illustrate various patterns for dispensing the lid seal material 110. The lid seal material 110 is slightly thicker than the die 105 and preform 103, establishing a bondline B 109 between the heat sink 101 and the upper surface of the die 105.

In FIG. 1D one or more clips 113 have been applied to the assembly. The clips 113 force 112 the heatsink 101 and substrate 106 together. This compresses the lid seal material 110 and forces the preform 103 to contact the heatsink 101. This establishes the final bondline 111. Accordingly, the bondline can be established by engineering the preform 103 thickness to desired parameters. With the clips in place 113, the lid seal materials 110 are cured at a temperature below the melting temperature of the preform 103. After curing, the lid seal materials 110 are substantially incompressible and are bonded to the heat sink 101 and substrate 106. Accordingly, the cured lid seal will fix the heat sink 101 and substrate 106 at the bondline distance 111. Therefore, during reflow, the preform 103 is not under pressure, and will not flow off of the die 105. In further embodiments, other systems for applying pressure to the assembly during lid cure may be employed. Additionally, during reflow, the clips 113 may be removed to reduce thermal mass or may be left in place without impacting the soldering process.

Figure 1E:
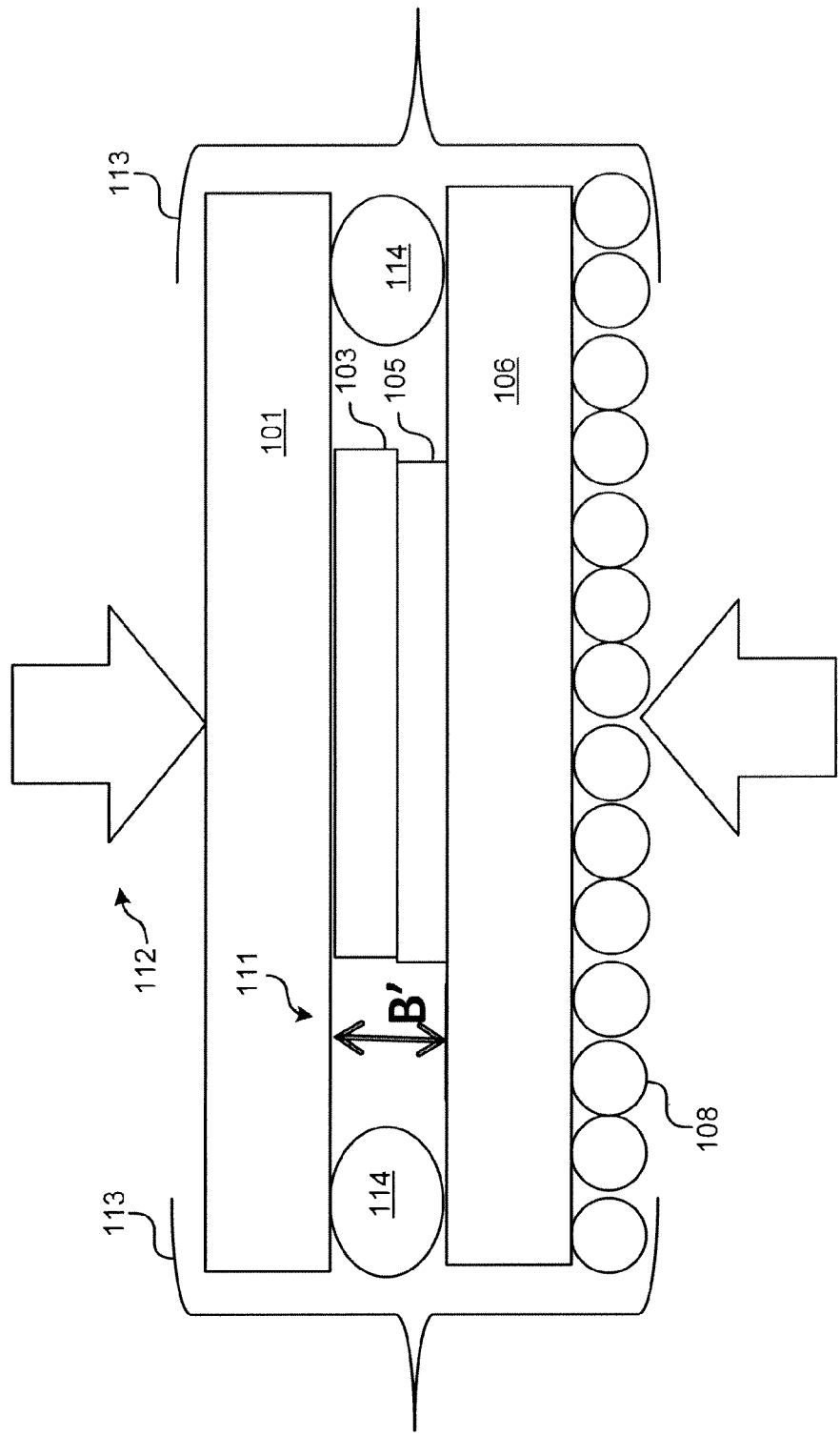
FIG. 1E illustrates an embodiment of the invention employing a fixture for establishing a bondline during reflow.

In other embodiments, the heat spreader 101 may not be attached to the substrate 106 using a lid seal process prior to soldering. An embodiment not utilizing a lid pre-cure is illustrated in FIG. 1E. In this embodiment, a shim or other fixture 114 is inserted between the heat spreader 101 and the substrate 106 to establish the desired bondline 111. In still further embodiments, the shim or fixture 114 may be integral with the clip 113.

Figure 2A:
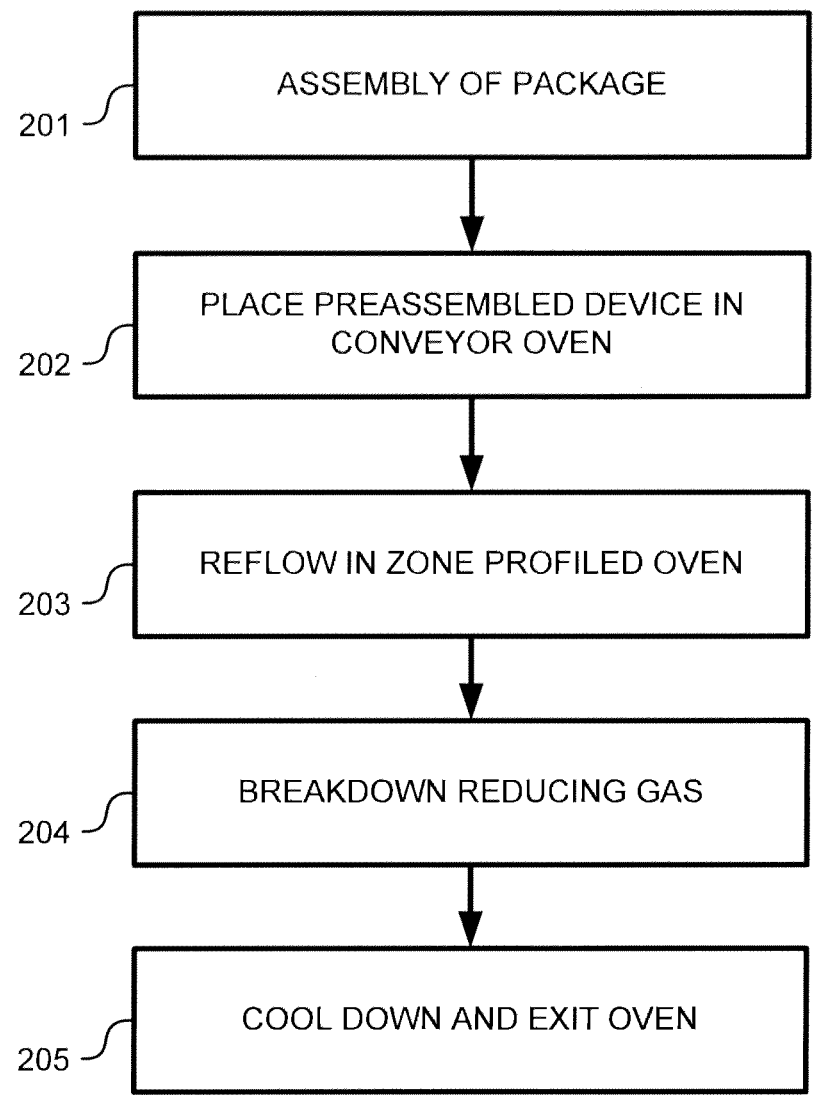
FIG. 2A illustrates a process flow according to an embodiment of the invention.

FIG. 2A illustrates a process flow according to an embodiment of the invention. In step 201, the package is pre-assembled. In some embodiments, the package comprises a substrate with metalized chip, a solder preform and a heat-spreader with solder able metallization and assembly of the package 201 comprises performing the lid cure process described with respect to FIGS. 1C and 1D In step 202, the pre-assembled device is placed in a conveyor oven. In some embodiments, if a pre-cure of lid seal has not been done ahead of time, a weight or force may be placed on the top of the heat spreader to force the heat spreader towards the die. If a pre-cure has not been conducted, the preform thickness may be used as a standoff during lid seal cure. By engineering the thickness of the preform before reflow to be the exact desired bondline, a weight or force can be applied to the heat spreader during head spreader cure. As long as the cure temp does not exceed the melt point of the solder preform, when the force pushes down on the heat spreader, the spreader will bottom out at the preform height and establish a bondline. The package lid seal will then cure at the bondline thickness so that subsequent reflows will not need a clip and a desired bondline is established.

It is important that the nitrogen and formic acid vapor can reach the solder preform and its interface. In some embodiments, only the corners need to be sealed with a polymer and air gaps or formic vapor pass-through gaps are created. Holes or gaps may also be machined or integrated into the spreader to assist this process.

In step 203, reflow takes place in a zone-profiled oven. In this embodiment, the oven is profiled in zones based on the solder that is used. The zoned oven provides a purging gas and an oxide dissolving vapor or gas. The purging gas provides an inert atmosphere (i.e., oxygen free) in the reflow oven and may comprise nitrogen, or other inert gases, such as argon. The oxide reduction vapor or gas may comprise formic acid vapor or other oxide reducing gases, such as simple carboxylic acid vapors. The reflow process 203 includes a temperature sufficient to breakdown the oxide reducing gas in step 204. For example, at 200 C, formic acid breaks down into carbon monoxide or carbon dioxide and water. If the oxide reducing gas breakdown temperature is below the melting temperature of the preform, the reflow process 203 further includes a temperature zone above the melting temperature of the preform. In some embodiments, pure indium may be employed as the thermal interface material. For pure indium solder joints it is recommended that peak temp of the profile is 200 C for the liquidus stage. Indium melts at 157 C but the profile peak reaches 200 C which in turn reflows the indium and breaks down the acid vapor all in one step. In step 205, the oven enters a cool down zone and after cool-down, the assembly exits the oven. Because the oxide reducing gas has been broken down into gasses during step 204, no residues remain and no cleaning is necessary.

Figure 2B:
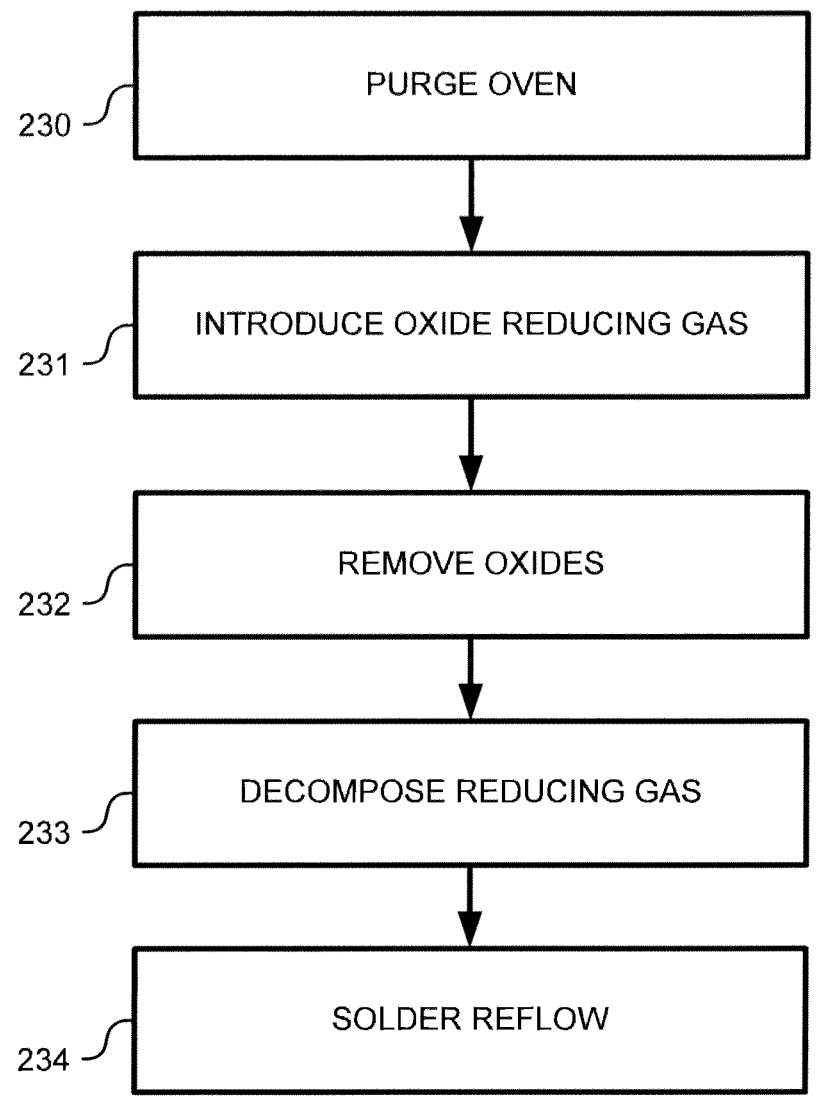
FIG. 2B illustrates a reflow process flow implemented in accordance with an embodiment of the invention.

FIG. 2B illustrates a more detailed process flow for a reflow profile implemented in accordance with an embodiment of the invention. In this embodiment, the reflow process begins 230 by purging the oven of oxygen. For example, the oven may be filled with an inert gas such as nitrogen or argon in a conventional manner. Afterwards, the oxide removing gas is introduced 231 into the oven—for example, through bubbling or other conventional method. The oven is then subjected to sufficient temperatures for a sufficient length of time to remove oxides 232 from the surfaces to be soldered. The oven is then subjected to sufficient temperatures 233 and 234 to decompose the reducing gas and reflow the solder. In some embodiments, the solder may reflow at a lower temperature than the decomposition of the reducing gas. In other embodiments, the gas may decompose at a lower temperature than the solder. Accordingly, steps 233 and 234 may be performed in either order. Additionally, steps 233 and 234 may be performed simultaneously by heating the oven to a sufficiently high temperature to both decompose the gas and reflow the solder. Afterwards, the oven is cooled down and vented. Because the oxide reducing gas is decomposed into gaseous molecules, no residue remains on the assembly, and there is no need to clean the assembled package.

Figure 3:
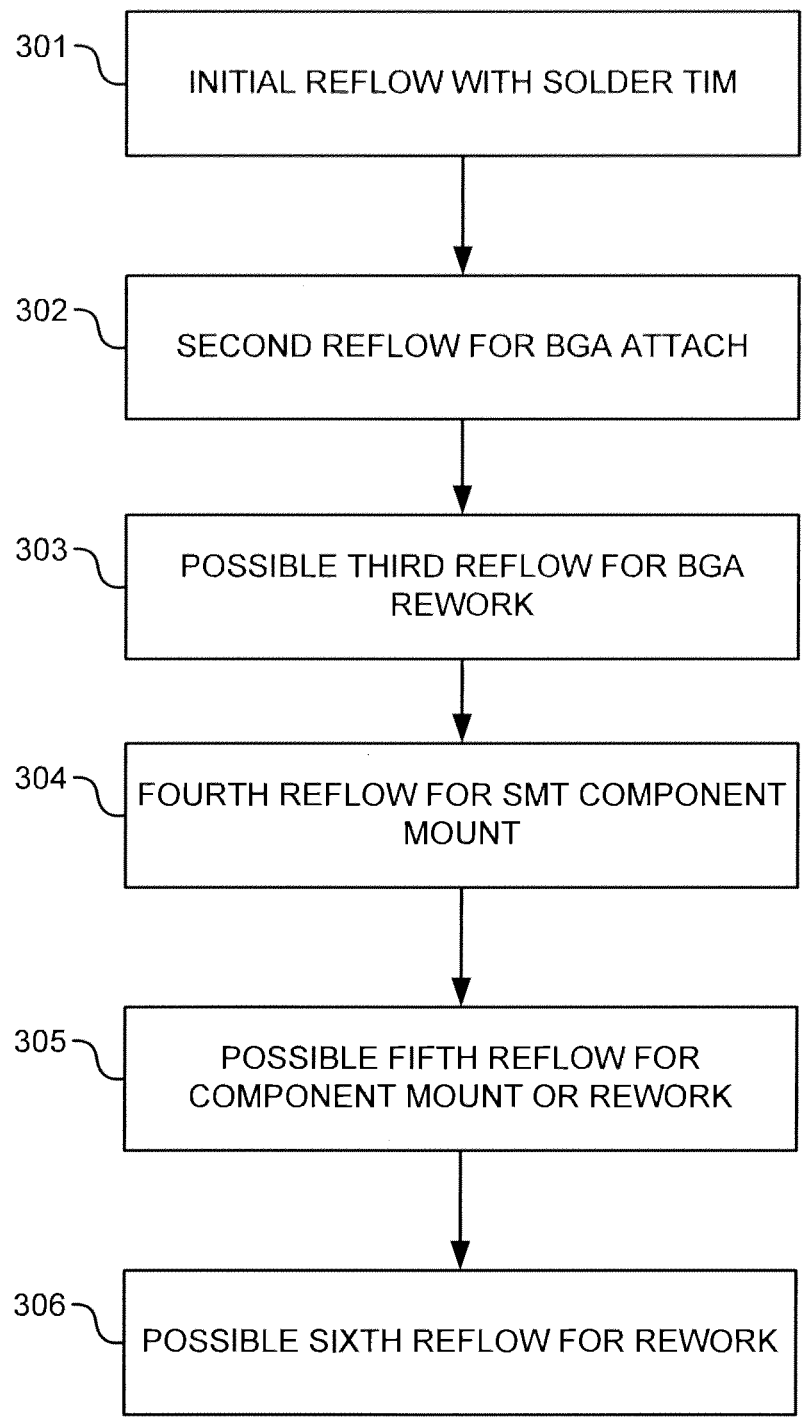
FIG. 3 shows a possible process in which a BGA solder TIM implemented in accordance with an embodiment may be reflowed many or multiple times.

FIG. 3 shows a possible process in which a BGA solder TIM implemented in accordance with an embodiment may be reflowed up to 6 times. A first reflow process 301 forms the solder-based thermal interface to attach the die to the heat spreader. A second reflow process 302 allows the package to be attached the board using a BGA. A third reflow process 303 may be employed for BGA rework. A third (or fourth in BGA reflow work is performed) reflow process 304 allows surface mount technology (SMT) components to be attached. In some embodiments, a fifth reflow 305 or sixth reflow 306 process may be used for additional component mounting or rework. Because the initial reflow process 301 employed a process without liquid flux, the subsequent reflow processes 302-306 can be performed at higher temperatures than the initial process 301. For example, the initial reflow 301 may be performed using a pure indium, indium alloy, or other low temperature solder preform while the subsequent reflows 302-306 may be performed with higher temperature solders, such as lead-free solders like tin-silver-copper (SAC) alloys. These further reflow processes may be performed at similar or elevated temperature profiles as the initial reflow 301. For example, when a solder material having a melting temperature of less than 200° C. is used in the initial reflow 301, subsequent reflows may be performed at temperature profiles for reflowing solder contact points that have melting temperatures between 100 and 350° C.

Figure 4:
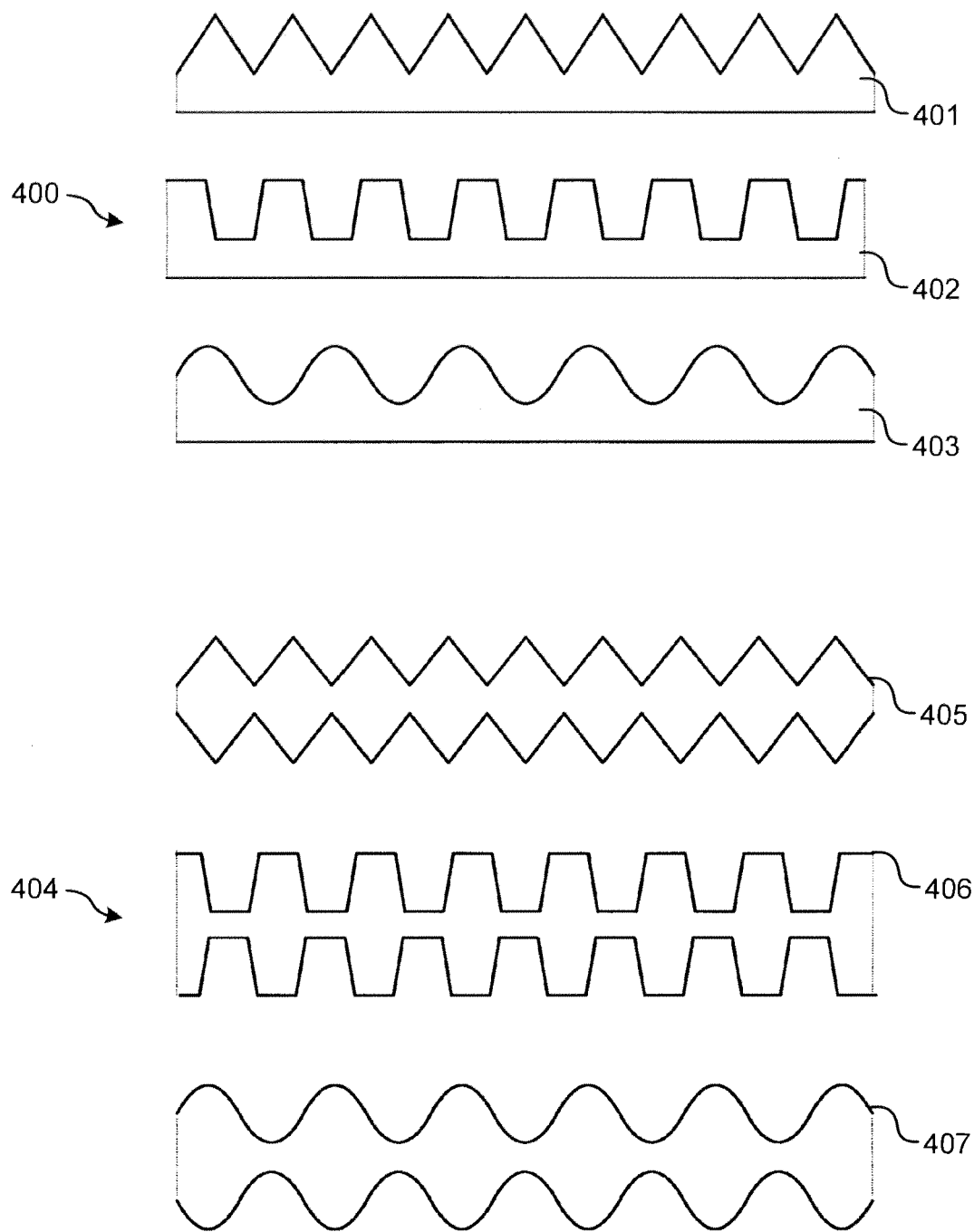
FIG. 4 illustrates some examples of preform textures that may be employed in embodiment of the invention.

As discussed above, to use a solder preform with formic acid vapor for oxide reduction, a pathway for the gas to reach the preform is provided. In one embodiment, a textured solder preform can facilitate the formic acid vapor reaching the entire interface between the preform and metalized regions. The textured foils can be used to allow the formic acid vapor to get under the preform and remove oxides. FIG. 4 illustrates some examples of preform textures that may be employed in embodiment of the invention. Both single sided 400 and double sided 404 preforms may be employed. For example, single sided or double preforms, with one side or both sides having saw tooth 401, 405, grooved 402, 406, or sinusoidal 403, 407 patterns may be employed. Further discussion and examples of textured solder preforms are found in U.S. Pat. No. 7,593,228, the contents of which are hereby incorporated in its entirety.

Figure 5:
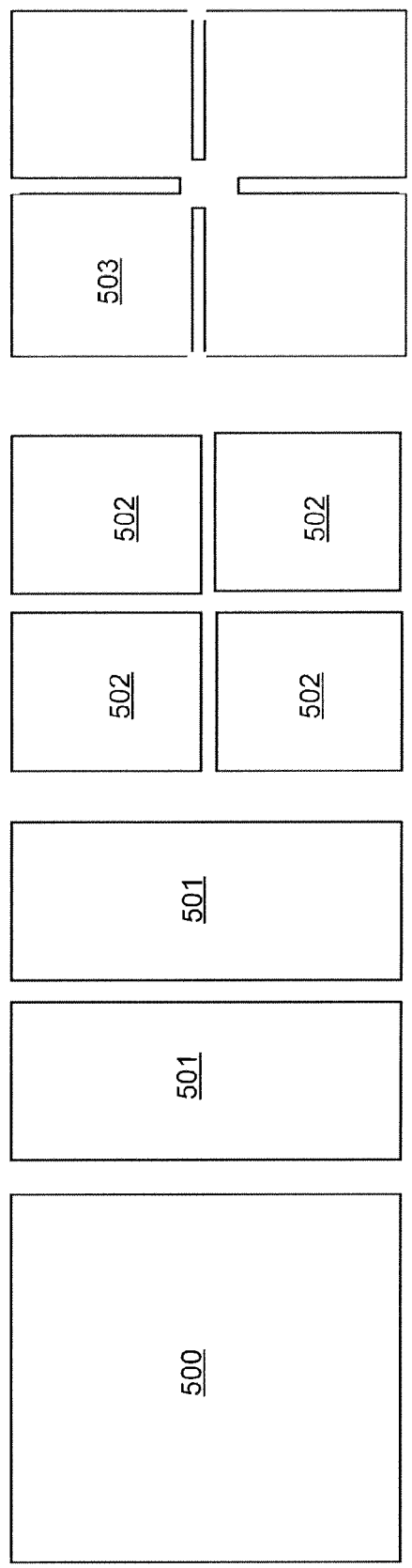
FIG. 5 illustrates examples of multiple preforms and preforms with slits implemented in accordance with an embodiment of the invention.
Figure 5:
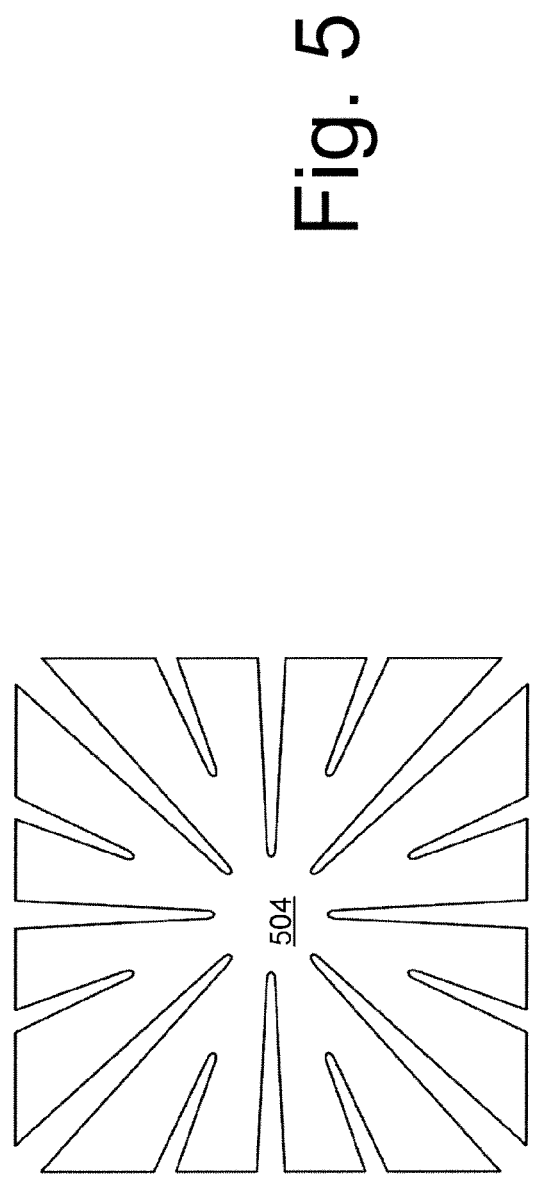

Another method to allow the formic acid vapor to reach the interfaces to remove oxides is to employ multiple preforms or a preform with slits removed from the preform. FIG. 5 illustrates examples of multiple preforms and preforms with slits in the preforms implemented in accordance with an embodiment of the invention. Placing multiple preforms side by side and allowing a channel in between them, or slitting the preforms to allow formic acid vapor to reach the interface is another way to increase performance of this application. For metals like Indium that do not wet extremely well, this process may not be helpful, and a single solid preform 500 may be employed. For Sn, Ag or lead containing solders that flow and wet very well, there is no issue with induced voids due to the gap formed by the separation of the two or more preforms. For example: two preforms 501 may be placed side by side with a single channel between them; four preforms 502 may be placed in four quadrants, with two channels formed; a channeled preformed 503 with four channels may be employed, or a multi-channeled preform 504 with varying lengths and locations of channels may be used.

As discussed above, in some embodiments a lid pre-cure process may be performed prior to reflow soldering the heat sink to the die. FIGS. 6A-6D illustrate various example dispensing patterns for the lid seal material. In FIG. 6A, the material 602 is dispensed as heads at the corners of the substrate 601. After cure, this provides air pathways 603 on each side of the substrate 601 for the oxide reducing gas to contact the preform during reflow. In FIG. 6B two walls of material 605 are dispensed on opposing sides of the substrate 604. This leaves the remaining two sides open 606 for gas to enter the assembly during reflow. In FIG. 6C, the substrate 607 is almost surrounded by material 609. Two sides are completely covered, while gaps are provided in the remaining two sides to allow gas to enter 608 the assembly during reflow. In FIG. 6D, the substrate 610 has four corners of material 612, forming four walls, each having a gap to allow gas to enter 611 the assembly during reflow. In additional embodiments, various other patterns of lid seal material may be applied provided a pathway exists for the oxide reducing gas to enter the assembly during reflow.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term including should be read as meaning "including, without limitation" or the like; the term "example" is used to provide exemplary instances of the item in discussion, not an exhaustive or limiting list thereof; the terms should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean, that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for attaching a heat spreader to a die, comprising:
   disposing a solid volume of solder between a die and a heat spreader without disposing a liquid flux between the die and the heat spreader, wherein the die is mounted to one face of a substrate, the substrate comprising a plurality of metalized contacts for solder attachment on the opposite face; and
   reflow soldering an assembly comprising the die, the heat spreader and the substrate in the presence of an inert and oxide reducing gas mixture under a first temperature profile to form a package capable of undergoing subsequent reflow processes at equal or elevated temperature profiles;
   wherein reflow soldering the assembly in the presence of an inert and oxide reducing gas mixture under a first temperature profile comprises subjecting the assembly to a first temperature for a sufficient length of time for the oxide reducing gas to reduce an amount of oxides present on surfaces to be soldered, and subsequently subjecting the assembly to a second temperature sufficient to decompose the oxide reducing gas.

2. The method of claim 1, wherein the step of reflow soldering the assembly takes place in a reflow oven, and further comprising:
   purging the reflow oven with an inert gas prior to the step of reflow soldering the assembly; and
   introducing the oxide reducing gas into the purged reflow oven prior to the step of reflow soldering the assembly.

3. The method of claim 1, wherein the die has a backside pre-deposited with a metallic layer to provide a surface fir soldering the die to the heat spreader.

4. The method of claim 1, wherein the heat spreader is an integrated heat spreader.

5. The method of claim 1, wherein the step of reflow soldering the assembly is performed using an inline conveyor oven.

6. The method of claim 1, wherein the solid volume of solder comprises a solder preform.

7. The method of claim 1, wherein the inert and oxide reducing gas mixture comprises a simple carboxylic acid vapor entrained in inert gas.

8. The method of claim 7, wherein the simple carboxylic acid vapor is methanoic (formic) acid vapor, ethanoic (acetic) acid vapor, or a mixture thereof.

9. The method of claim 1, further comprising mounting the soldered assembly on a printed circuit board using an array of solder contact points.

10. The method of claim 6, wherein the solder perform is composed of a first solder material having a melting temperature below 200° C. and the solder contact points are composed of a second solder material having a melting temperature between 100 and 350° C.

11. The method of claim 10, further comprising subjected the soldered assembly to a plurality of further reflow processes, the plurality of further reflow processes having higher temperature profiles than the first temperature profile.

12. The method of claim 9, wherein the step of mounting the soldered assembly on the printed circuit board is performed using a higher temperature profile than the first temperature profile.

13. The method of claim 10, wherein the first solder material is pure indium or an indium alloy.

14. The method of claim 13, wherein the second solder material is a lead-free solder material.

15. The method of claim 1, further comprising:
   attaching the heat spreader to the substrate using a lid seal cure process; and
   applying a force to the heat spreader during the curing process, and
   wherein the solid volume of solder has a predetermined thickness to provide a desired bondline or standoff height that is substantially the same as a finished bondline after reflow.

16. The method of claim 15, wherein the force is applied using a weight or a clip.

17. The method of claim 15, wherein the lid seal cure process does not hermetically seal the solid volume of solder.

18. The method of claim 1, wherein the heat spreader comprises a metallization layer lacking a precious metal layer.

19. The method of claim 1, further comprising inserting a fixture between the heat spreader and the die to maintain a predetermined standoff height during the step of reflow soldering.

20. The method of claim 19, further comprising forcing the heat spreader towards the die during the step of reflow soldering.

21. The method of claim 1, wherein the solid volume of solder has a textured surface adjacent to the heat spreader or the die.

22. The method of claim 1, wherein the solid volume of solder has a first textured surface adjacent to the heat spreader and a second textured surface adjacent to the die.

23. The method of claim 1, wherein the solid volume of solder is one of a plurality of solder preforms spaced apart by at least one channel.

24. The method of claim 1, wherein the solid volume of solder comprises a plurality slits extending from the center of the volume toward the periphery of the volume, wherein the slits are configured to close during the reflow solder process without forming voids.

25. The method of claim 1, further comprising not cleaning the soldered assembly prior to a subsequent reflow application.

26. The method of claim 1, wherein the inert and oxide reducing gas mixture consists essentially of one or more simple carboxylic acid gases entrained in one or more inert gases.

* * * * *